United States Patent
Fukuda et al.

(10) Patent No.: US 6,433,118 B1
(45) Date of Patent: Aug. 13, 2002

(54) COPOLYMER, A MANUFACTURING PROCESS THEREFOR AND A SOLUTION CONTAINING THEREOF

(75) Inventors: Ritsuko Fukuda; Toshiro Takao; Keiichi Ikeda; Yoshihiro Yamamoto, all of Kanagawa (JP)

(73) Assignee: Mitsui Chemicals, Inc. (JP)

( * ) Notice: Subject to any disclaimer, the term of this patent is extended or adjusted under 35 U.S.C. 154(b) by 0 days.

(21) Appl. No.: 09/418,370

(22) Filed: Oct. 14, 1999

(30) Foreign Application Priority Data

Oct. 15, 1998 (JP) .......................... 10-294281

(51) Int. Cl.[7] .......................................... C08F 220/10
(52) U.S. Cl. ..................... 526/328.5; 526/317.1; 526/318.4; 526/319; 526/329; 526/347
(58) Field of Search .................. 526/317.1, 318.4, 526/319, 328.5, 329, 347

(56) References Cited

FOREIGN PATENT DOCUMENTS

| JP | 56-52886 | 12/1981 |
| --- | --- | --- |
| JP | 59-207971 | 11/1984 |
| JP | 59-207972 | 11/1984 |
| JP | 61-293249 | 12/1986 |
| JP | 62-039536 | 2/1987 |
| JP | 01-106835 | 4/1989 |
| JP | 01-172406 | 7/1989 |
| JP | 01-177380 | 7/1989 |
| JP | 4-46914 | * 2/1992 |
| JP | 06-289608 | 10/1994 |
| JP | 08-094827 | 4/1996 |
| JP | 08-094829 | 4/1996 |
| JP | 09-292709 | 11/1997 |

* cited by examiner

*Primary Examiner*—Helen L. Pezzuto
(74) *Attorney, Agent, or Firm*—Burns, Doane, Swecker & Mathis, L.L.P.

(57) ABSTRACT

This invention discloses a copolymer comprising structural units represented by formulas (1) to (3):

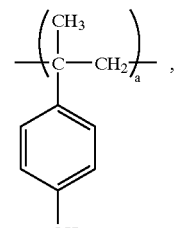

(1)

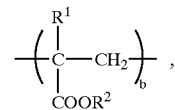

(2)

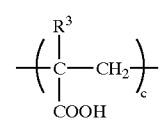

(3)

where $R^1$ and $R^3$ are each hydrogen or methyl and $R^2$ is $C_1$–$C_6$ straight or branched unsubstituted alkyl or $C_1$–$C_6$ straight or branched substituted alkyl;

wherein a, b and c are 0.05 to 0.7, 0.15 to 0.8 and 0.01 to 0.5, respectively and a+b+c=1.

29 Claims, 5 Drawing Sheets

COPOLYMER, A MANUFACTURING PROCESS THEREFOR AND A SOLUTION CONTAINING THEREOF

BACKGROUND OF THE INVENTION

1. Field of the Invention

This invention relates to a novel copolymer of 4-(1-methylethenyl)phenol, a (meth)acrylate and a (meth)acrylic acid (PIPE copolymer) as well as a manufacturing process therefor and a solution containing thereof. In particular, it provides a copolymer of 4-(1-methylethenyl)phenol, a (meth)acrylate and a (meth)acrylic acid useful as, for example, a base polymer in a positive photosensitive composition used for, e.g., manufacturing a color filter; relates to a process for manufacturing the copolymer from industrially available 4-(1-methylethenyl)phenol, a (meth)acrylate and a (meth)acrylic acid; and provides a solution comprising the copolymer containing particular concentrations of remaining monomer components.

Furthermore, the copolymer of this invention is useful as a metal finishing agent for protecting a metal surface and improving corrosion resistance and paint-adhesion property of the metal surface.

2. Description of the Related Art

Recently, a color filter has been extensively used for a variety of multicolored liquid-crystal color displays such as a liquid-crystal color television. Such a color filter has been conventionally manufactured by, for example, screen printing and electrodeposition. However, as a color display has been improved for its resolution, it has been more important to refine a pattern. Thus, a variety of patterning processes utilizing photolithography have been investigated.

For example, JP-A 8-94827 discloses a process for manufacturing a color filter comprising the steps of (1) forming a transparent conductive layer on a transparent substrate; (2) forming a positive photosensitive coating layer; (3) exposing a part of the transparent conductive layer; (4) forming a colored area by electrodeposition; and (5) repeating steps (3) and (4) as required. Of these steps, a pattern refinement level depends on steps (2) and (3), in which photolithography is used. In particular, it significantly depends on a positive photosensitive composition applied on the transparent conductive layer. The above invention employs a positive photosensitive composition essentially comprising (a) a polymer containing both carboxyl and hydroxyphenyl groups in one molecule, (b) a compound containing two or more vinyl ether groups in one molecule, and (c) a compound generating an acid by irradiating an active energy beam.

This photosensitive composition is developed as follows; by heating the film on which the positive photosensitive composition has been applied, an addition reaction of the carboxyl group and/or hydroxyphenyl group with the vinyl ether group forms a crosslink, which is insoluble to a solvent or an alkali developing solution, and then, after irradiating with an active energy beam and then, as necessary, heating the film, an acid generated in the irradiated area acts as a catalyst to break the crosslink structure and thus to again make the irradiated area soluble to a solvent or an alkali developing solution. For further improving a resolution, a preferable polymer (base polymer) in a positive photosensitive composition is one containing both carboxyl and hydroxyphenyl groups in one molecule which meets all the following five requirements as much as possible;

(a) a higher solubility to a solution which solves a crosslinking agent, an acid-generating agent and others (solvent solubility);

(b) a certain dissolution rate of the broken crosslink moieties in an alkali developing solution after exposure (dissolution rate in an alkali developing solution);

(c) good diffusivity of an acid generated by irradiation with an active energy beam (acid diffusivity);

(d) transparency of a photosensitive coating at an exposure wavelength (transparency); and (e) thermal stability during the heating step after application of the film and exposure (thermal stability).

As an example of a polymer meeting these requirements to some degree, a copolymer from p-hydroxystyrene, n-butyl. acrylate and acrylic acid has been disclosed in, for example, JP-A 8-94827 and 8-94829. We have, however, investigated the copolymer for its performance and have come to a conclusion that it is insufficiently soluble in a solvent or thermally stable.

A main starting material, p-hydroxystyrene, for the copolymer may be prepared by any of conventional processes; for example, (a) reacting p-tert-butoxyphenyl halide with metal magnesium to form p-tert-butoxyphenylmagnesium halide, which is then reacted with vinyl halide in the presence of a nickel-phosphine complex catalyst to form p-tert-butoxystyrene (JP-A 1-106835), and then breaking the tert-butoxy group with, for example, an acid to provide p-hydroxystyrene; and (b) converting p-halogenophenol via Grignard reaction into p-(t-butoxy)phenylmagnesium halide, which is then reacted with tri-n-alkyl borate, hydrolyzing a resulting reaction product, and treating a product with hydrogen peroxide to provide p-hydroxystyrene (JP-A 62-39536).

For both processes, there are many problems; for example, the process consists of complex multiple stages, metal components such as magnesium and nickel must be removed from a product, and using magnesium halide leads to a large amount of metal halide, a byproduct, which requires complicated treatment. In the process described in (a), an expensive complex containing phosphine ligand is used as a catalyst, and therefore, recovery and recycle of the catalyst is indispensable, which makes the process more complicated. In the process described in (b), a large amount of tri-n-alkyl borate must be used, which makes separation of the product from the borate and treatment of the borate more complicated. Thus, p-hydroxystyrene cannot be said to be an industrially available starting material. A copolymer from the compound has not, therefore, been used as a base polymer for a positive photosensitive composition.

On the other hand, 4-(1-methylethenyl)phenol can be readily prepared by thermal decomposition of 2,2-bis(4'-oxyphenyl)propane (hereinafter, referred to as "bisphenol A" (a popular name)) (e.g., JP-B 56-52886). Therefore, industrially available 4-(1-methylethenyl)-phenol has been paid attention. Furthermore, it is expected that the compound has considerably different properties such as higher thermal stability or acid-diffusivity and modified solubility because of effects of its α-methyl-group. A copolymer prepared using 4-(1-methylethenyl)phenol as a monomer has been intensely investigated for a variety of applications.

For example, JP-As 6-289608 and 9-292709 disclose binary copolymers of 4-(1-methylethenyl)phenol and tert-alkyl acrylate as an example of a polymer for a radiosensitive (resist) composition. On irradiating an active energy beam, these copolymers change solubility in their irradiated part due to an acid derived from a compound capable of generating an acid by an active beam, and then may act as a positive resist by using an alkali developing solution. Thus, the technique utilizes instability of a tert-alkyl ester group to an acid. Such a copolymer, however, has an insufficient dissolution rate in an alkali developing solution and insufficient acid diffusivity, and is poorly reactive to a vinyl ether compound as a crosslinking agent. It cannot be, therefore, used as it is.

JP-A 61-293249 discloses a binary copolymer of 4-(1-methylethenyl)phenol and n-butyl acrylate as an example of a copolymer for a resin composition exhibiting damping property. The copolymer has an extremely lower dissolution rate in an alkali developing solution and is poorly compatible with a vinyl ether compound. It cannot be, therefore, used as it is.

On the other hand, a variety of techniques have been developed, in which a metal surface is chemically treated to form a non-metallic film over the metal for improving surfacequality. For example, JP-As 59-207971, 59-207972, 1-172406 and 1-177380 disclose that derivatives of poly-4-vinylphenol are useful as such a metal finishing agent. These metal finishing agents, however, exhibit corrosion. resistance or paint adhesion property insufficient to be practically used.

SUMMARY OF THE INVENTION

An objective of this invention is to provide a copolymer comprising industrially available 4-(1-methylethenyl) phenol as a structural unit and useful as a positive photosensitive composition for manufacturing a color filter, as well as a convenient process for manufacturing the copolymer.

Another objective of this invention is to provide a copolymer exhibiting improved corrosion resistance and paint adhesion property as a metal finishing agent, and a convenient process for manufacturing the copolymer.

To achieve the above objectives, we have prepared a variety of copolymers using 4-(1-methylethenyl)phenol and different monomers, to investigate them for their relationship between their basic physical properties and structures, and then have surprisingly found that a copolymer prepared from 4-(1-methylethenyl)phenol, a (meth)acrylate and a (meth)acrylic acid as structural units in a particular composition ratio can meet all the above five requirements ((a) solvent solubility, (b) dissolution rate in an alkali developing solution, (c) acid diffusivity, (d) transparency and (e) thermal stability).

Furthermore, we have investigated effects of different compounds in a polymerization solution after copolymerizing 4-(1-methylethenyl)phenol, a (meth)acrylate and a (meth)acrylic acid as well as of the composition and the molecular weight of the copolymer, on resist properties. Then, we have surprisingly found that a polymerization solution prepared by a particular process, containing the copolymer having a particular composition in a particular amount and containing a certain amount of remaining monomers can provide a copolymer which can meet all the above five requirements ((a) solvent solubility, (b) dissolution rate in an alkali developing solution, (c) acid diffusivity, (d) transparency and (e) thermal stability).

We have used the copolymer as an additive for a metal finishing agent, and have surprisingly found that it can achieve higher corrosion resistance and paint adhesion property than any conventional agent.

Thus, this invention provides;

(I) a copolymer comprising structural units represented by formula (1):

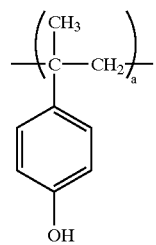

formula (2):

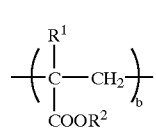

where $R^1$ is hydrogen or methyl and $R^2$ is $C_1$–$C_6$ straight or branched unsubstituted alkyl or $C_1$–$C_6$ straight or branched substituted alkyl, and formula (3):

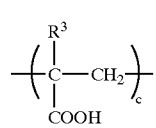

where $R^3$ is hydrogen or methyl,
wherein the mole fractions, a, b and c, are 0.05 to 0.7, 0.15 to 0.8 and 0.01 to 0.5, respectively and a+b+c=1;

(II) a copolymer described in (I) where a, b and c are 0.10 to 0.45, 0.30 to 0.8 and 0.05 to 0.30, respectively and a+b+c=1;

(III) a copolymer described in (I) where a, b and c are 0.10 to 0.30, 0.50 to 0.8 and 0.05 to 0.20, respectively and a+b+c=1;

(IV) a copolymer described in any of (I) to (III) where $R^2$ in the structural unit represented by formula (2) is $C_1$–$C_6$ straight or branched unsubstituted primary or secondary alkyl or $C_1$–$C_6$ straight or branched hydroxylated primary or secondary alkyl;

(V) a copolymer described in any of (I) to (III) where $R^2$ in the structural unit represented by formula (2) is selected from the group consisting of methyl, ethyl, n-propyl, isopropyl, n-butyl, isobutyl, sec-butyl and 2-hydroxyethyl;

(VI) a copolymer described in any of (I) to (III) whose weight-average molecular weight and molecular-weight dispersion are 3,000 to 50,000 and 1.0 to 3.0, respectively;

(VII) a copolymer described in any of (I) to (III) whose glass transition point is 30 to 150° C.;

(VIII) a copolymer described in any of (I) to (III) whose transmittance at 350 nm is at least 90%/μm;

(IX) a copolymer described in any of (I) to (III) whose dissolution rate in a 2.38 wt % aqueous solution of tetramethylammonium hydroxide is at least 1 μm/min.;

(X) a process for manufacturing a copolymer described in (I), comprising heating a mixture of (a) 4-(1-methylethenyl)phenol, (b) a (meth)acrylate represented by formula (4):

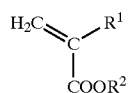

(4)

where $R^1$ is hydrogen or methyl and $R^2$ is $C_1$–$C_6$ straight or branched unsubstituted alkyl or $C_1$–$C_6$ straight or branched substituted alkyl, (c) a (meth)acrylic acid represented by formula (5):

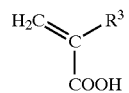

(5)

where $R^3$ is hydrogen or methyl, (d) a radical-polymerization initiator, and (e) a solvent, in which the mole fractions of 4-(1-methylethenyl)phenol (a), the (meth)acrylate (b) and the (meth)acrylic acid (c) are 0.05 to 0.7, 0.15 to 0.8 and 0.01 to 0.5, respectively and the total of the mole fractions is 1;

(XI) a process for manufacturing a copolymer described in (II), comprising heating a mixture of (a) 4-(1-methylethenyl)phenol, (b) a (meth)acrylate represented by formula (4), (c) a (meth)acrylic acid represented by formula (5), (d) a radical-polymerization initiator, and (e) a solvent, in which the mole fractions of 4-(1-methylethenyl)phenol (a), the (meth)acrylate (b) and the (meth)acrylic acid (c) are 0.10 to 0.45, 0.30 to 0.8 and 0.05 to 0.30, respectively and the total of the mole fractions is 1;

(XII) a process for manufacturing a copolymer described in (III), comprising heating a mixture of (a) 4-(1-methylethenyl)phenol, (b) a (meth)acrylate represented by formula (4), (c) a (meth)acrylic acid represented by formula (5), (d) a radical-polymerization initiator, and (e) a solvent, in which the mole fractions of 4-(1-methylethenyl)phenol (a), the (meth)acrylate (b) and the (meth)acrylic acid (c) are 0.10 to 0.30, 0.50 to 0.8 and 0.05 to 0.20, respectively and the total of the mole fractions is 1;

(XIII) a process described in any of (X) to (XII) heating the materials while continuously or intermittently supplying 4-(1-methylethenyl)phenol (a), the (meth)acrylate (b) and/or the (meth)acrylic acid (c) into the reaction system to maintain the total concentration of (a), (b) and (c) in the reaction system at 20 wt % or lower throughout the heating step;

(XIV) a process described in any of (X) to (XII) where the (meth)acrylate represented by formula (4) is selected from the group consisting of unsubstituted primary or secondary alkyl acrylate, hydroxylated primary or secondary alkyl acrylate, unsubstituted primary or secondary alkyl methacrylate, and hydroxylated primary or secondary alkyl methacrylate;

(XV) a process described in (XIV) where the (meth)acrylate represented by formula (4) is selected from the group consisting of methyl acrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butyl methacrylate, isobutyl methacrylate, sec-butyl methacrylate and 2-hydroxyethyl methacrylate;

(XVI) a process described in any of (X) to (XII) where the radical-polymerization initiator is selected from the group consisting of azobisisobutyronitrile, azobis-2,4-dimethylvaleronitrile, azobiscyclohexane-carbonitrile, dimethyl azobisisobutyrate, benzoyl peroxide, 2,4-dichlorobenzoyl peroxide, di-tert-butyl peroxide, peroxylauroyl, peroxydiisopropyl dicarbonate and acetyl peroxide;

(XVII) a process described in any of (X) to (XII) where the materials are heated at 50 to 180° C.;

(XVIII) a solution containing 25 to 75 wt % of a copolymer described in (I) prepared by heating a mixture of (a) 4-(1-methylethenyl)phenol, (b) a (meth)acrylate represented by formula (4), (c) a (meth)acrylic acid represented by formula (5), (d) a radical-polymerization initiator, and (e) a resist solvent, in which the mole fractions of (a), (b) and (c) are 0.05 to 0.7, 0.15 to 0.8 and 0.01 to 0.5, respectively and the total of the mole fractions is 1, and then optionally concentrating or diluting the mixture to adjust the concentrations of (a), (b) and (c) in the whole solution to 50 ppb to 0.5 wt %, 5 ppm to 5 wt % and 200 ppb to 2 wt %, respectively;

(XIX) a solution described in (XVIII) containing 25 to 75 wt % of a copolymer described in (II), where the mole fractions of (a), (b) and (c) are 0.10 to 0.45, 0.30 to 0.8 and 0.05 to 0.30, respectively and the total of the mole fractions is 1, and the concentrations of (a), (b) and (c) in the whole solution are adjusted to 50 ppb to 0.5 wt %, 5 ppm to 5 wt % and 200 ppb to 2 wt %, respectively;

(XX) a solution described in (XVIII) containing 25 to 75 wt % of a copolymer described in (III), where the mole fractions of (a), (b) and (c) are 0.10 to 0.30, 0.50 to 0.8 and 0.05 to 0.20, respectively and the total of the mole fractions is 1, and the concentrations of (a), (b) and (c) in the whole solution are adjusted to 50 ppb to 0.5 wt %, 5 ppm to 5 wt % and 200 ppb to 2 wt %, respectively;

(XXI) a solution described in any of (XVIII) to (XX) where the (meth)acrylate represented by formula (4) is selected from the group consisting of unsubstituted, primary or secondary alkyl acrylate, hydroxylated primary or secondary alkyl acrylate, unsubstituted primary or secondary alkyl methacrylate, and hydroxylated primary or secondary alkyl methacrylate;

(XXII) a solution described in (XXI) where the (meth)acrylate represented by formula (4) is selected from the group consisting of methyl acrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butyl methacrylate,. isobutyl methacrylate, sec-butyl methacrylate and 2-hydroxyethyl methacrylate;

(XXIII) a solution described in any of (XVIII) to (XX) where the radical-polymerization initiator is selected from the group consisting of azobisisobutyro-nitrile, azobis-2,4-dimethylvaleronitrile, azobiscyclohexanecarbonitrile, dimethyl azobisisobutyrate, benzoyl peroxide, 2,4-dichlorobenzoyl peroxide, di-tert-butyl peroxide, peroxylauroyl, peroxydiisopropyl dicarbonate and acetyl peroxide;

(XXIV) asolution described in any of (XVIII) to (XX) where the resist solvent is selected from the group consisting of ketones, alcohols, polyols, polyol derivatives, cyclic ethers and esters;

(XXV) a solution described in any of (XVIII) to (XX) where throughout heating, (a) 4-(1-methylethenyl) phenol, (b) a (meth)acrylate and/or (c) a (meth)acrylic acid are continuously or intermittently supplied to maintain the total concentration of (a), (b) and (c) at 20 wt % or lower;

(XXVI) a solution described in any of (XVIII) to (XX) where the materials are heated at 50 to 180° C.;

(XXVII) a solution described in any of (XVIII) to (XX) where the concentrations of (a), (b) and (c) in the whole solution are 100 ppb to 0.1 wt %, 10 ppm to 3 wt %, and 500 ppb to 1 wt %., respectively;

(XXVIII) a solution described in any of (XVIII) to (XX) where the film formed by applying the solution on a substrate and then heating the substrate has a dissolution rate in a 2.38 wt % aqueous solution of tetramethylammonium hydroxide is at least 1 $\mu$m/min;

(XXIX) a solution described in any of (XVIII) to (XX) where the film formed by applying the solution on a quartz substrate and then heating the substrate has a transmittance of at least 90%/$\mu$m at 350 nm.

According to this invention, there can be provided a copolymer of 4-(1-methylethenyl)phenol, a (meth)acrylate and a (meth)acrylic acid, which is useful as, for example, a base polymer for a positive photosensitive composition used in, for example, manufacturing a color filter.

The copolymer may be readily prepared by radical polymerization of 4-(1-methylethenyl)phenol, a (meth)acrylate and a (meth)acrylic acid in particular charging conditions.

Furthermore, the copolymer exhibits improved corrosion resistance and paint-adhesion property as a metal finishing agent.

DETAILED DESCRIPTION OF THE PREFERRED EMBODIMENTS

Figure 1:
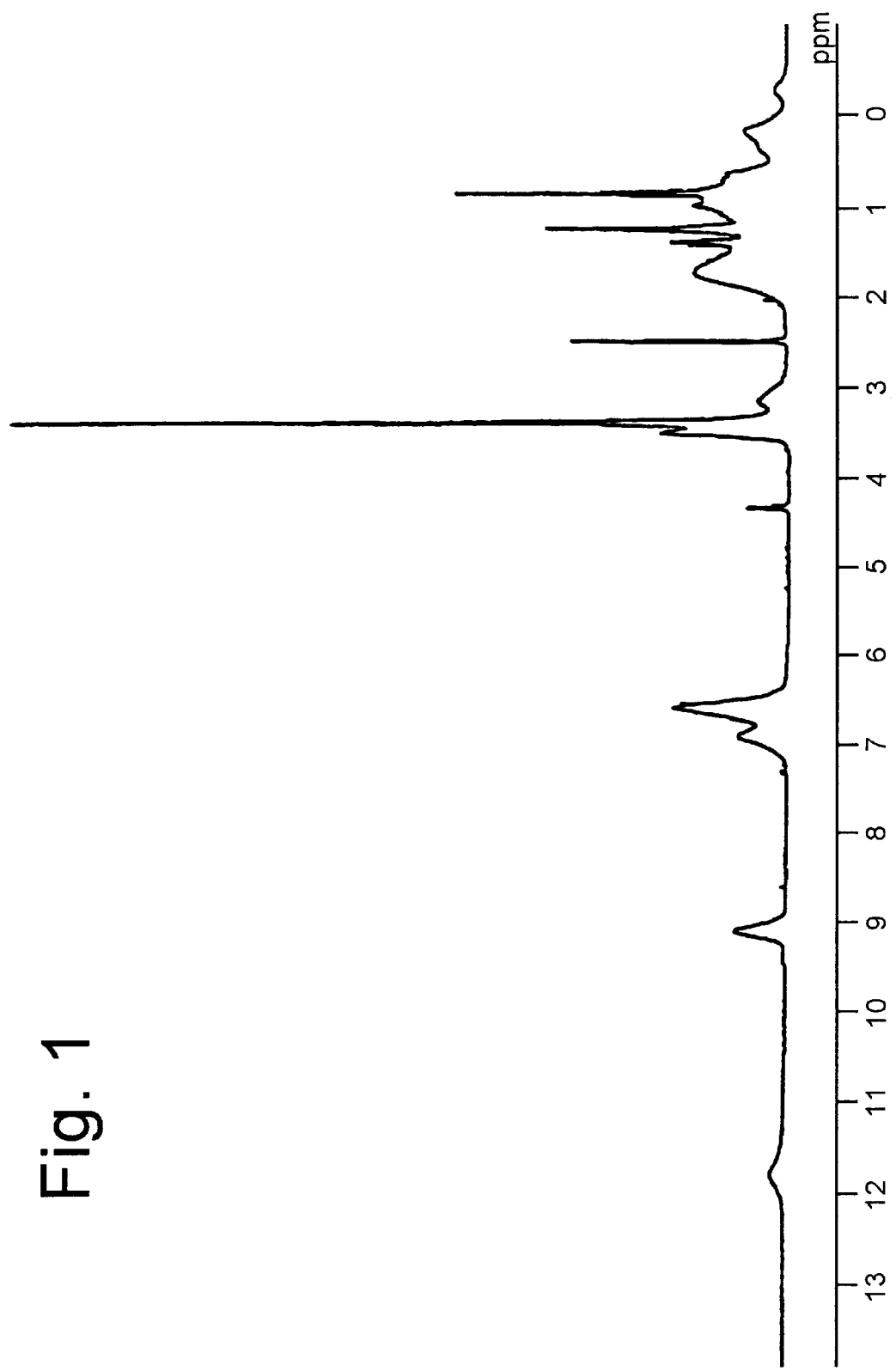
FIG. 1 shows an $^1$H-NMR spectrum of the copolymer of 4-(1-methylethenyl)phenol, (meth)methyl acrylate and (meth)acrylic acid prepared in Example 1, in $d_6$-dimethylsulfoxide.

A copolymer according to this invention comprises the structural units represented by formulas (1), (2) and (3). In one embodiment, the mole fractions, a, b and c, are 0.05 to 0.7, 0.15 to 0.8, and 0.01 to 0.5, respectively, and a+b+c=1.

In a preferable embodiment, a, b and c are 0.10 to 0.45, 0.30 to 0.8, and 0.05 to 0.30, respectively; more preferably, 0.10 to 0.30, 0.50 to 0.8 and 0.05 to 0.20, respectively, and a+b+c=1.

In formula (2), $R^2$ is $C_1$–$C_6$ straight or branched unsubstituted alkyl or $C_1$–$C_6$ straight or branched substituted alkyl, including, for example, unsubstituted alkyls such as methyl, ethyl, n-propyl, isopropyl, n-butyl, isobutyl, sec-butyl, t-butyl, cyclohexyl and cyclopentyl; hydroxylated alkyls such as hydroxymethyl, 1-hydroxyethyl, 2-hydroxyethyl, 1-hydroxy-n-propyl, 2-hydroxy-n-propyl, 3-hydroxy-n-propyl, 1-hydroxyisopropyl, 2,3-dihydroxy-n-propyl, 1-hydroxy-n-butyl, 2-hydroxy-n-butyl, 3-hydroxy-n-butyl and 4-hydroxy-n-butyl; alkoxylated alkyls such as methoxymethyl, ethoxymethyl, 1-methoxyethyl, 2-methoxyethyl, 2-ethoxyethyl, 1-methoxy-n-propyl, 2-methoxy-n-propyl, 4-methoxy-n-butyl, 2-(2-ethoxyethoxy) ethyl, glycidyl, tetrahydrofurfuryl and 2-tetrahydrofuryl; halogenated alkyls such as 2,2,2-trifluoroethyl, hexafluoroisopropyl, 2,2,3,4,4,4-hexafluorobutyl, 2-chloroethyl, trichloroethyl, 2-bromoethyl and heptafluoro-2-propyl; cyanated alkyls such as 2-cyanoethyl; dialkylaminated alkyls such as 2-(dimethylamino)ethyl, 3-(dimethylamino)propyl and 3-dimethylamino-neopentyl.

Preferably, $R^2$ is $C_1$–$C_6$ straight or branched unsubstituted primary or secondary alkyl or $C_1$–$C_6$ straight or branched hydroxylated primary or secondary alkyl; more preferably, methyl, ethyl, n-propyl, isopropyl, n-butyl, isobutyl, sec-butyl or 2-hydroxyethyl. The copolymer of the present invention may comprise two or more types of the structural unit represented by formula (2). Specifically, this invention may encompass a copolymer comprising four or more structural units; for example, a copolymer comprising. structural units of one type of formula (1), two or more types of formula (2) and one type of formula (3).

In formula (3), $R^3$ is hydrogen or methyl. Again, either or both of these structural units represented by formula (3) may be contained in a copolymer.

In the copolymer of this invention, the composition ratios of the structural units represented by formulas (1), (2) and (3) are considerably important. Assuming that there is a relationship a+b+c=1 between the composition ratios of a, b and c, a, b and c are generally 0.05 to 0.7, 0.15 to 0.8 and 0.01 to 0.5, respectively; preferably, 0.10 to 0.45, 0.30 to 0.8 and 0.05 to 0.30, respectively; more preferably, 0.10 to 0.30, 0.50 to 0.8 and 0.05 to 0.20, respectively. When two or more types of the structural units represented by formulas (2) and/or (3) are present, the composition ratio of b or c is its total composition ratio. Composition ratios a, b and c are determined by $^1$H-NMR and $^{13}$C-NMR.

The copolymer of this invention may be a copolymer in which the structural units represented by formulas (1), (2) and (3) are randomly copolymerized; these three. structural units are alternately copolymerized; or these units are block-copolymerized. A preferable copolymer is one largely comprising a moiety in which the structural unit represented by formula (1) and the structural unit represented by formula (2) or (3) are alternately copolymerized. Specifically, the most preferable copolymer is an alternating copolymer comprising structural units represented by formula (6):

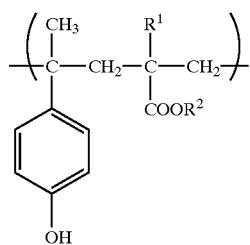

(6)

where $R^1$ is hydrogen or methyl and $R^2$ is $C_1$–$C_6$ straight or branched unsubstituted alkyl or $C_1$–$C_6$ straight or branched substituted alkyl, and formula (7):

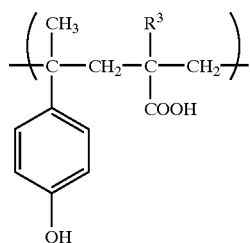

(7)

where $R^3$ is hydrogen or methyl,
wherein the ratio between the total content of these structural units [X] and the content of a structural unit in a homopolymer moiety represented by formula (8) [Y]:

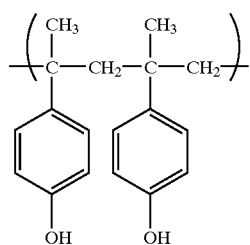

(8)

i.e., [Y]/[X], is 0.5 or less preferably 0.1 or less, more preferably 0.05 or less.

A weight-average molecular weight (Mw) of the copolymer of this invention may vary, depending on its application. For example, when used as a base polymer in a photosensitive composition, it is generally 3,000 to 50,000, preferably 4,000 to 40,000, more preferably 5,000 to 30,000. Molecular-weight dispersion (Mw/Mn) is generally 1.0 to 4.0, preferably 1.0 to 3.0, and more preferably 1.0 to 2.5. A weight-average molecular weight and molecular-weight dispersion are determined by gel permeation chromatography (GPC) which is converted into polystyrene.

A glass transition point for the copolymer of this invention may depend on its composition or composition ratio, but generally 0 to 200° C., preferably 30 to 150° C., and more preferably 50 to 120° C. A glass transition point is determined with. a differential scanning calorimeter (DSC).

The copolymer of this invention exhibits excellent transparency. Its transmittance at 350 nm is generally at least 70%/μm, preferably at least 90%/μm, and more preferably at least 95%/μm. A transmittance is determined at 350 nm for a 1 μm thick film formed on a quartz substrate by spin coating, with a spectrophotometer for ultraviolet and visible region.

Furthermore, the copolymer of this invention exhibits excellent solubility in an aqueous alkali solution. A dissolution rate in a 2.38 wt % aqueous solution of tetramethylammonium hydroxide (standard alkali developing solution) is generally 1 μm/min, and preferably 5 μm/min. A dissolution rate is determined by applying the copolymer on a copper-coated substrate with a bar coater, heating it at 80° C. for 30 min to form a film 5 μm of thickness, immersing it in a 2.38 wt % aqueous solution of tetramethylammonium hydroxide and then measuring the film thickness with a dial thickness gage.

Preferably, the copolymer of this invention has good solubility property in a 1.0 wt % aqueous solution of sodium carbonate (alkalescent developing solution). Specifically, the dissolution rate is preferably at least 0.1 μm/min, more preferably at least 1.0 μm/min, most preferably 2.5 to 60 μm/min both inclusive, extremely preferably 3.5 to 10 μm/min both inclusive.

The copolymer of this invention may be prepared by heating a mixture of (a) 4-(1-methylethenyl)phenol, (b) a (meth)acrylate represented by formula (4), (c) a (meth) acrylic acid represented by formula (5), (d) a radical-polymerization initiator and (e) a solvent in which (a), (b) and (c) are contained in particular mole fractions.

One material in the process of this invention, 4-(1-methylethenyl)phenol, may be readily prepared by thermal decomposition of bisphenol A (e.g., JP-B 56-52886).

Examples of the (meth)acrylate represented by formula (4) as another material in the process of this invention are $C_1$–$C_6$ straight or branched unsubstituted acrylates or methacrylates and $C_1$–$C_6$ straight or branched substituted acrylates or methacrylates, including unsubstituted alkyl acrylates such as methyl acrylate, ethyl acrylate, n-propyl acrylate, isopropyl acrylate, n-butyl acrylate, isobutyl acrylate, sec-butyl acrylate, t-butyl acrylate, cyclohexyl acrylate and cyclopentyl acrylate; hydroxylated-alkyl acrylates such as hydroxymethyl acrylate, 1-hydroxyethyl acrylate, 2-hydroxyethyl acrylate, 1-hydroxy-n-propyl acrylate, 2-hydroxy-n-propyl acrylate, 3-hydroxy-n-propyl acrylate, 1-hydroxyisopropyl acrylate, 2,3-dihydroxypropyl acrylate, 1-hydroxy-n-butyl acrylate, 2-hydroxy-n-butyl acrylate, 3-hydroxy-n-butyl acrylate and 4-hydroxy-n-butyl acrylate; alkoxylated-alkyl acrylates such as methoxymethyl acrylate, ethoxymethyl acrylate, 1-methoxyethyl acrylate, 2-methoxyethyl acrylate, 2-ethoxyethyl acrylate, 1-methoxy-n-propyl acrylate, 2-methoxy-n-propyl acrylate, 4-methoxy-n-butyl acrylate, 2-(2-ethoxyethoxy)ethyl acrylate, glycidyl acrylate, tetrahydrofurfuryl acrylate and 2-tetrahydrofuryl acrylate; halogenated-alkyl acrylates such as 2,2,2-trifluoroethyl acrylate, hexafluoroisopropyl acrylate, 2,2,3,4,4,4-hexafluorobutyl acrylate, 2-chloroethyl acrylate, trichloroethyl acrylate, 2-bromoethyl acrylate and heptafluoro-2-propyl acrylate; cyanated-alkyl acrylates such as 2-cyanoethyl acrylate; dialkylaminated-alkyl acrylates such as 2-(dimethylamino)ethyl acrylate, 3-(dimethylamino) propyl acrylate and 3-dimethylamino-neopentyl acrylate; unsubstituted alkyl methacrylates such as methyl methacrylate, ethyl methacrylate, n-propyl methacrylate, isopropyl methacrylate, n-butyl methacrylate, isobutyl methacrylate, sec-butyl methacrylate, t-butyl methacrylate, cyclohexyl methacrylate and cyclopentyl methacrylate; hydroxylated-alkyl methacrylates such as hydroxymethyl methacrylate, 1-hydroxyethyl methacrylate, 2-hydroxyethyl methacrylate, 1-hydroxy-n-propyl methacrylate, 2-hydroxy-n-propyl methacrylate, 3-hydroxy-n-propyl methacrylate, 1-hydroxyisopropyl methacrylate, 2,3-dihydroxypropyl methacrylate, 1-hydroxy-n-butyl methacrylate, 2-hydroxyn-butyl methacrylate, 3-hydroxy-n-butyl methacrylate and 4-hydroxy-n-butyl methacrylate; alkoxylated-alkyl methacrylates such as methoxymethyl methacrylate, ethoxymethyl methacrylate, 1-methoxyethyl methacrylate, 2-methoxyethyl methacrylate, 2-ethoxyethyl methacrylate, 1-methoxy-n-propyl methacrylate, 2-methoxy-n-propyl methacrylate, 4-methoxy-n-butyl methacrylate, 2-(2-ethoxyethoxy)ethyl methacrylate, glycidyl methacrylate, tetrahydrofurfuryl methacrylate and 2-tetrahydrofuryl methacrylate; halogenated-alkyl methacrylates such as 2,2,2-trifluoroethyl methacrylate, hexafluoroisopropyl methacrylate, 2,2,3,4,4,4-hexafluorobutyl methacrylate, 2-chloroethyl methacrylate, trichloroethyl methacrylate, 2-bromoethyl methacrylate and heptafluoro-2-propyl methacrylate; cyanated-alkyl methacrylates such as 2-cyanoethyl methacrylate; dialkylaminated-alkyl methacrylates such as 2-(dimethylamino)ethyl methacrylate, 3-(dimethylamino) propyl methacrylate and 3-dimethylamino-neopentyl methacrylate.

Among others, preferable (meth)acrylates are unsubstituted primary or secondary alkyl acrylates, hydroxylated primary or secondary alkyl acrylates, unsubstituted primary or secondary alkyl methacrylates and hydroxylated primary or secondary alkyl methacrylates; morepreferable (meth)acrylates are methylacrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butylmethacrylate, isobutylmethacrylate, sec-butyl methacrylate and 2-hydroxyethyl methacrylate. These (meth)acrylates may be used alone, concurrently or as a mixture of two or more. In the latter case, there may be formed a copolymer where two or more types of the structural unit represented by formula (2) are randomly copolymerized, in which a composition ratio b is the total of the composition ratios for two or more types of the structural unit represented by formula (2).

A (meth)acrylic acid represented by formula (5) as another material in the process of this invention is an acrylic or methacrylic acid, which may be used alone, concurrently or as a mixture of two.

These 4-(1-methylethenyl)phenol, a (meth)acrylate or a (meth)acrylic acid may contain additives; for example, a stabilizer such as an alkali compound including potassium hydroxide or a polymerization inhibitor. These materials are preferably subject to a common purification process such as recrystallization and distillation for removing a stabilizer before their use, while commercially available materials may be used as they are without any purification process.

The amounts of 4-(1-methylethenyl)phenol, a (meth) acrylate and a (meth)acrylic acid are preferably selected to be their composition ratios in a desired copolymer. Specifically, the mole fractions of 4-(1-methylethenyl) phenol, a (meth)acrylate and a (meth)acrylic acid are 0.05 to 0.7, 0.15 to 0.8, and 0.01 to 0.5, respectively and the total of these mole fractions is 1; preferably 0.1 to 0.45, 0.30 to 0.8, and 0.05 to 0.30, respectively; and more preferably 0.10 to 0.30, 0.50 to 0.8, and 0.05 to 0.20, respectively.

A radical-polymerization initiator in the process of this invention may be any of initiators used in a common radical polymerization; for example, azo initiators such as azobisisobutyronitrile, azobis-2,4-dimethylvalero-nitrile, azobiscyclohexanecarbonitrile, azobis-2-amidinopropane hydrochloride, dimethyl azobisisobutyrate, azobisisobutylamidine hydrochloride and 4,4'-azobis-4-cyanovaleric acid; peroxide initiators such as benzoyl peroxide, 2,4-dichlorobenzoyl peroxide, di-tert-butyl peroxide, lauroyl peroxide, acetyl peroxide, peroxydiisopropyl dicarbonate, cumene hydroperoxide, tert-butyl hydroperoxide, dicumyl peroxide, p-menthane hydroperoxide, pinane hydroperoxide, methyl ethyl ketone peroxide, cyclohexanone peroxide, diisopropyl peroxydicarbonate, tert-butyl peroxylaurate, di-tert-butyl peroxyphthalate, dibenzyl oxide and 2,5-dimethylhexane-2,5-dihydroperoxide; and redox initiators such as benzoyl peroxide-N,N-dimethylaniline and peroxodisulfuric acid-sodium hydrogen sulfite.

Among others, preferable initiators are azo initiators and peroxide initiators. More preferable initiators are azobisisobutyronitrile, azbbis-2,4-dimethylvaleronitrile, azobiscyclohexanecarbonitrile, dimethyl azobisisobutyrate, benzoyl peroxide, 2,4-dichlorobenzoyl peroxide, di-tert-butyl peroxide, lauroyl peroxide, peroxydiisopropyl dicarbonate and acetyl peroxide. These radical-polymerization initiators may be used alone or two or more of them may be used concurrently or sequentially.

These initiators may be used in a mole fraction of 0.0001 to 0.1, preferably 0.001 to 0.1 andmorepreferably 0.005 to 0.05, to the total amount of (a) 4-(1-methylethenyl)phenol, (b) a (meth)acrylate represented by formula (4) and (c) a (meth)acrylic acid represented by formula (5). In the process of this invention, all of these radical-polymerization initiators may be charged at the beginning of heating, or all or a part of these may be added after initiation of heating as long as the total amount of the initiators is within the limits.

In the process of this invention, any solvent may be used as long as it does not adversely affect the desired reaction; for example, ketones such as acetone, methyl ethyl ketone, methyl isobutyl ketone, cyclohexanone; cyclopentanone and γ-butyrolactone; alcohol such as n-propyl alcohol, isopropyl alcohol, n-butyl alcohol, tert-butyl alcohol, n-octanol, 2-ethylhexanol and n-dodecyl alcohol; glycols such as ethylene glycol, propylene glycol and diethylene glycol; ethers such as ethylene glycol dimethyl ether, ethylene glycol diethyl ether, diethylene glycodl dimethyl ether, diethylene glycol diethyl ether, diethylene glycol methyl ethyl ether, tetrahydrofuran and dioxane; alcohol ethers such as ethylene glycol monomethyl ether, ethylene glycol monoethyl ether, propylene glycol monomethyl ether, propylene glycol monoethyl ether and diethylene glycol monomethyl ether; esters such as n-propyl formate, isopropyl formate, n-butyl formate, methyl acetate, ethyl acetate, n-propyl acetate, isopropyl acetate, n-butyl acetate, isobutyl acetate, n-amyl acetate, n-hexyl acetate, methyl propionate, ethyl propionate and methyl butyrate; monooxycarboxylates such as methyl 2-oxypropionate, ethyl 2-oxypropionate, n-propyl 2-oxypropionate, isopropyl 2-oxypropionate, ethyl 2-oxy-2-methylpropionate and methyl 2-oxy-3-methylbutyrate; alkoxycarboxylates such as ethyl methoxyacetate, ethyl ethoxyacetate, methyl 3-methoxypropionate, ethyl 3-methoxypropionate and methyl 3-ethoxypropionate; cellosolve esters such as cellosolve acetate, methyl cellosolve acetate, ethyl cellosolve acetate and butyl cellosolve acetate; aromatic hydrocarbons such as benzene, toluene and xylenes; halogenated hydrocarbons such as trichloroethylene, chorobenzene and dichlorobenzene; and amides such as dimethylacetamide, dimethylformamide, N-methylacetamide, N-methylpyrrolidone and N,N'-dimethylimidazolidinone.

These solvents may be used alone or as a mixture of two or more. It is preferable that these solvents are used to give a homogeneous reaction solution, but the reaction mixture may consist of heterogeneous two or more phases. The amount of the solvent may vary depending on a variety of factors such as materials to be used, the type and the amount of a radical-polymerization initiator, and the molecular weight of a desired copolymer, but generally 5 to 10,000 wt parts, preferably 20 to 5,000 wt parts, and more preferably 30 to 1,000 wt parts, to 100 wt parts of the total amount of the materials.

Polymerization in the process of this invention may be conducted in any style of batch, semi-batch or continuous flow, as long as (a) 4-(1-methylethenyl)phenol, (b) a (meth) acrylate represented by formula (4), (c) a (meth)acrylic acid represented by formula (5), (d) a radical-polymerization initiator, (e) a solvent and others are effectively mixed and contacted with each other. Generally, all of these materials may be charged in a reactor before heating, or alternatively materials, a radical-polymerization initiator and a solvent may be continuously or intermittently added into a reactor in which at least a part of the solvent has been charged.

Among these styles, in the process of this invention, the reaction is preferably conducted, maintaining the total concentration of 4-(1-methylethenyl)phenol, a (meth)acrylate and a (meth)acrylic acid at 20 wt % or less in the reaction system throughout the heating step. In particular, as 4-(1-methylethenyl)phenol, a (meth)acrylate and a (meth)acrylic acid are consumed by polymerization, these materials are continuously or intermittently supplied into the reaction system in an appropriate amount. More specifically, the materials and a radical-polymerization initiator may be continuously or intermittently added into a reactor in which a solvent has been charged; the materials may be continuously or intermittently added into a reactor in which a solvent and a radical-polymerization initiator have been charged; into a reactor in which parts of a solvent and a radical-polymerization initiator have been charged, the materials and the remaining solvent and radical-polymerization initiator may be continuously or intermittently added; or alternatively, into a reactor in which parts of the materials, a solvent and a radical-polymerization initiator have been charged, the remaining materials, solvent and radical-polymerization initiator may be continuously or intermittently added.

In the process of this invention, a polymerization reaction proceeds by heating. Heating may be conducted at any temperature which may allow the reaction to proceed. The temperature may vary depending on various factors such as a polymerization degree, a composition and a composition ratio in a desired copolymer and the types and the amounts of a radical-polymerization initiator and a solvent, but generally 50 to 250° C., preferably 50 to 180° C., and more preferably 60 to 160° C.

A polymerization duration may also vary depending on various factors such as a polymerization degree, a composition and a composition ratio in a desired copolymer and the types and the amounts of a radical-polymerization initiator and a solvent, but generally up to 40 hours, preferably 0.01 to 20 hours. The reaction may be conducted under a reduced, ambient or elevated pressure.

The polymerization reaction in the process of this invention is preferably conducted in an atmosphere of an inert gas such as nitrogen and argon, but may be conducted in the presence of molecular oxygen, e.g., in the air.

In the process of this invention, additives such as a phenol compound may be used for, e.g., improving a yield of the copolymer and altering the sequence of the structural units in the copolymer.

After the completion of the polymerization reaction, a product copolymer may be isolated from the reaction solution by a common technique such as solvent extraction, fractional precipitation and film evaporation.

When the isolated copolymer is used as a component for a resist composition, it requires to be the isolated copolymer again dissolved in a solvent (resist solvent). It is, therefore, preferable that a polymerization solution itself obtained after copolymerization of 4-(1-methylethenyl)phenol, a (meth) acrylate and a (meth)acrylic acid is useful as a material for a resist composition, without any isolation operation.

Such a copolymer-containing solution is a solution containing a copolymer at 25 to 75 wt %, which comprises the structural units represented by formulas (1), (2) and (3) and in which a, b and c are 0.05 to 0.7, 0.15 to 0.8 and 0.01 to 0.5, respectively and a+b+c=1, and is prepared by heating a mixture of (a) 4-(1-methylethenyl)phenol, (b) a (meth) acrylate represented by formula (4), (c) a (meth)acrylic acid represented by formula (5), (d) a radical-polymerization initiator and (e) a resist solvent in which the mole fractions of (a), (b) and (c) are 0.05 to 0.7, 0.15 to 0.8 and 0.01 to 0.5, respectively and their total is 1, and then optionally concentrating or diluting the mixture, to adjust the concentrations of (a), (b) and (c) in the whole solution to 50 ppb to 0.5 wt %, 5 ppm to 5 wt % and 200 ppb to 2 wt %, respectively.

A preferable solution contains a copolymer at 25 to 75 wt %, in which a, b and c are 0.10 to 0.45, 0.30 to 0.8 and 0.05 to 0.30, respectively and a+b+c=1, and is prepared from the above mixture in which the mole fractions of (a), (b) and (c) are 0.10 to 0.45, 0.30 to 0.8 and 0.05 to 0.30, respectively and their total is 1 and the concentrations of (a), (b) and (c) in the whole solution are adjusted to 50 ppb to 0.5 wt %, 5 ppm to 5 wt % and 200 ppb to 2 wt %, respectively.

A more preferable solution contains a copolymer at 25 to 75 wt %, in which a, b and c are 0.10 to 0.30, 0.50 to 0.8 and 0.05 to 0.20, respectively and a+b+c=1, and is prepared from the above mixture in which the mole fractions of (a), (b) and (c) are 0.10 to 0.30, 0.50 to 0.8 and 0.05 to 0.20, respectively and their total is 1 and the concentrations of (a), (b) and (c) in the whole solution are adjusted to 50 ppb to 0.5 wt %, 5 ppm to 5 wt % and 200 ppb to 2 wt %, respectively.

In the resist solution in this invention, (a) 4-(1-methylethenyl)phenol, (b) a (meth)acrylate represented by formula (4), (c) a (meth)acrylic acid represented; by formula (5) and (d) a radical-polymerization initiator are as defined above.

A resist solvent in this invention may be a solvent commonly used for dissolving and applying a resist composition on a substrate to form a resist film; for example, ketones such as acetone, methyl ethyl ketone, cyclohexanone, methyl isoamyl ketone, 2-heptanone and methyl-2-n-amyl ketone; alcohols such as 3-methoxybutanol, 3-methyl-3-methoxybutanol, 1-methoxy-2-propanol and 1-ethoxy-2-propanol; polyols such as ethylene glycol, diethylene glycol, propylene glycol and dipropylene glycol; polyol derivatives such as ethylene glycol monoacetate, diethylene glycol monoacetate, propylene glycol monoacetate and monomethyl, monoethyl, monopropyl, monobutyl and monophenyl ethers of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl 3-methoxypropidnate, ethyl 3-ethoxypropionate, tert-butyl acetate and tert-butyl propionate; preferably, ketones, alcohols, polyols, polyol derivatives, cyclic ethers and esters; more preferably, cyclohexanone, diethylene glycol monomethyl ether acetate, 1-ethoxy-2-propanol, propylene glycol monomethyl ether and ethyl lactate.

These solvents may be used alone or as a mixture of two or more. The amount of the solvent may vary depending on a variety of factors such as materials to be used, the type and the amount of a radical-polymerization initiator, and the molecular weight of a desired copolymer, but generally 5 to 10,000 wt parts, preferably 20 to 5,000 wt parts, more preferably 30 to 1,000 wt parts, to 100 wt parts of the total amount of the materials. Most preferably, it is selected to give a copolymer concentration of 25 to 75 wt % without adjusting the concentration after polymerization, i.e., 33 to 300 wt parts.

The most essential point for the solution in this invention is to adjust the concentrations of (a), (b) and (c) in the whole solution to 50 ppb to 0.5 wt %, 5 ppm to 5 wt % and 200 ppb to 2 wt %, respectively. Generally, polymerization incompletely proceeds in radical polymerization, leaving unreacted monomer materials. For the solution of this invention, polymerization must be conducted in a manner that the amount of the remaining monomers is within the above limits. Preferably, the concentrations of (a), (b) and (c) are 100 ppb to 0.1 wt %, 10 ppm to 3 wt % and 500 ppb to 1 wt %, respectively.

Thus, for the solution of this invention, a mixture of (a), (b), (c), (d) and (e) is heated and then optionally concentrated or diluted. A heating temperature is generally 50 to 250° C., preferably 50 to 180° C., more preferably 60 to 160° C. The solution is concentrated when the concentration of the copolymer is less than 25 wt % after heating, while the solution is diluted when the concentration is higher than 75 wt %.

A film formed from the solution of this invention has excellent solubility in an aqueous alkali solution. A film formed by applying the solution on a substrate and then heating it generally has a dissolving rate in a 2.38 wt % aqueous solution of tetramethylammonium hydroxide (standard alkali developing solution) of 1 $\mu$m/min or higher, and preferably 5 $\mu$m/min or higher.

Preferably, the solution may provide a film exhibiting excellent solubility in a 1.0 wt % aqueous solution of sodium carbonate (alkalescent developing solution). The dissolution rate of the film is at least 0.1 $\mu$m/min, preferably at least 1.0 $\mu$m/min, more preferably at least 2.5 $\mu$m/min, most preferably 2.5 $\mu$m/min to 60 $\mu$m/min both inclusive, and extremely preferably 3.5 $\mu$m/min to 10 $\mu$m/min both inclusive.

A film formed from the solution of this invention exhibits excellent transparency. A film formed by applying the solution on a quartz substrate and then heating it generally has a transparency at 350 nm of at least 70%/$\mu$m, preferably at least 90%/$\mu$m, and more preferably at least 95%/$\mu$m.

A copolymer consisting of 4-(1-methylethenyl)phenol, a (meth)acrylate and a (meth)acrylic acid of this invention as well as a solution containing thereof are useful as, for example, a base polymer in a positive photosensitive composition for manufacturing a color filter which is used for making a display (e.g., a liquid-crystal display) multicolored. For example, a copolymer of this invention is mixed with polyvinyl ether, a photosensitive acid-generating compound and a sensitizing pigment to prepare a photosensitive composition. The composition is applied on a glass substrate on which a transparent conductive layer has been formed, with a spinner, and then dried by heating, to form a positive photosensitive film layer. The film is closely covered with a mask having a given pattern, exposed via the mask and heated, and then developed with an alkali developing solution to form a desired pattern on the transparent conductive layer. Using a copolymer of this invention or a solution containing thereof, this pattern may be formed precisely and reliably.

A copolymer of this invention and a solution containing thereof, may be also used in combination with a crosslinking agent having an N-methylol structure such as an amino resin as a resin material, i.e., an acid-curing photosensitive black resin composition which is used for forming a black matrix used as a shielding film between blue, red and green pixels in a color filter in a display such as a liquid-crystal display.

Furthermore, a copolymer of this invention may be useful as a polymer in a metal finishing agent for improving corrosion resistance and paint-adhesion property of a metal surface by forming a protective film on the metal surface. Specifically, it is useful for after-treatment of a metal surface which has been subject to a phosphate conversion treatment or a treatment of forming a chemical conversion coating, or for a treatment of an untreated metal surface such as aluminum, steel and zinc. For example, an aqueous solution for treating a metal surface containing a copolymer of this invention and at least one metal ion selected from the group consisting of titanium, zirconium, hafnium, zinc, nickel, cobalt, manganese, aluminum, calcium and magnesium is in contact with a metal surface from which grease and dust have been removed by washing, or on a metal surface which has been washed, has been subject to forming a chemical conversion coating, and then has been rinsed with water. Then, the treated metal surface is dried and then painted. This treatment may significantly improve corrosion resistance and paint-adhesion property of the metal surface.

This invention will be specifically described with reference to Examples. They are, however, only descriptive, and thus should not be interpreted to be restrictive in any manner.

EXAMPLE 1

Into a 1,000 mL (inner volume) four-necked flask equipped with an agitator, a thermometer, a condenser and a 500 mL (inner volume) dropping funnel was charged 200 mL of tetrahydrofuran, which was then refluxed with stirring by heating at an external temperature of 80° C. with a water bath. Into a separate 1,000 mL Erlenmeyer flask were charged 134.2 g of 4-(1-methylethenyl)phenol (hereinafter, referred to as "PIPE") (1.00 mol) purified by crystallization from its 2-ethylhexanol solution, 143.8 g of methyl acrylate (1.67 mol) purified by distillation, 48.3 g of acrylic acid (0.67 mol), 16.4 g of azobisisobutyronitrile (0.10 mol) as a radical-polymerization initiator and 200 mL of tetrahydrofuran as a solvent.

The latter mixture was stirred until it became a solution. The whole solution was transferred in the dropping funnel in two portions, and was added dropwise in the above four-necked flask in such a rate that refluxing was maintained. During the polymerization reaction, the internal temperature rose from 72° C. at the beginning to 80° C. after 8 hours. continuing stirring, the water bath was removed and the reaction mixture was allowed to be cooled to room temperature (25° C.) over 2 hours. The polymerization solution was poured into 2 L of n-hexane in a 5 L beaker, to precipitate a product polymer. The precipitated polymer was separated by filtration and again dissolved in 400 mL of tetrahydrofuran. The solution was poured into 2 L of n-hexane to precipitate a solid. This procedure of filtration, separation and precipitation were further repeated twice. At the end of the last filtration-separation, the solid was dried under a reduced pressure of 100 mmHg at 100° C. for 2 hours to give 320.4 g of white polymer.

Figure 2:
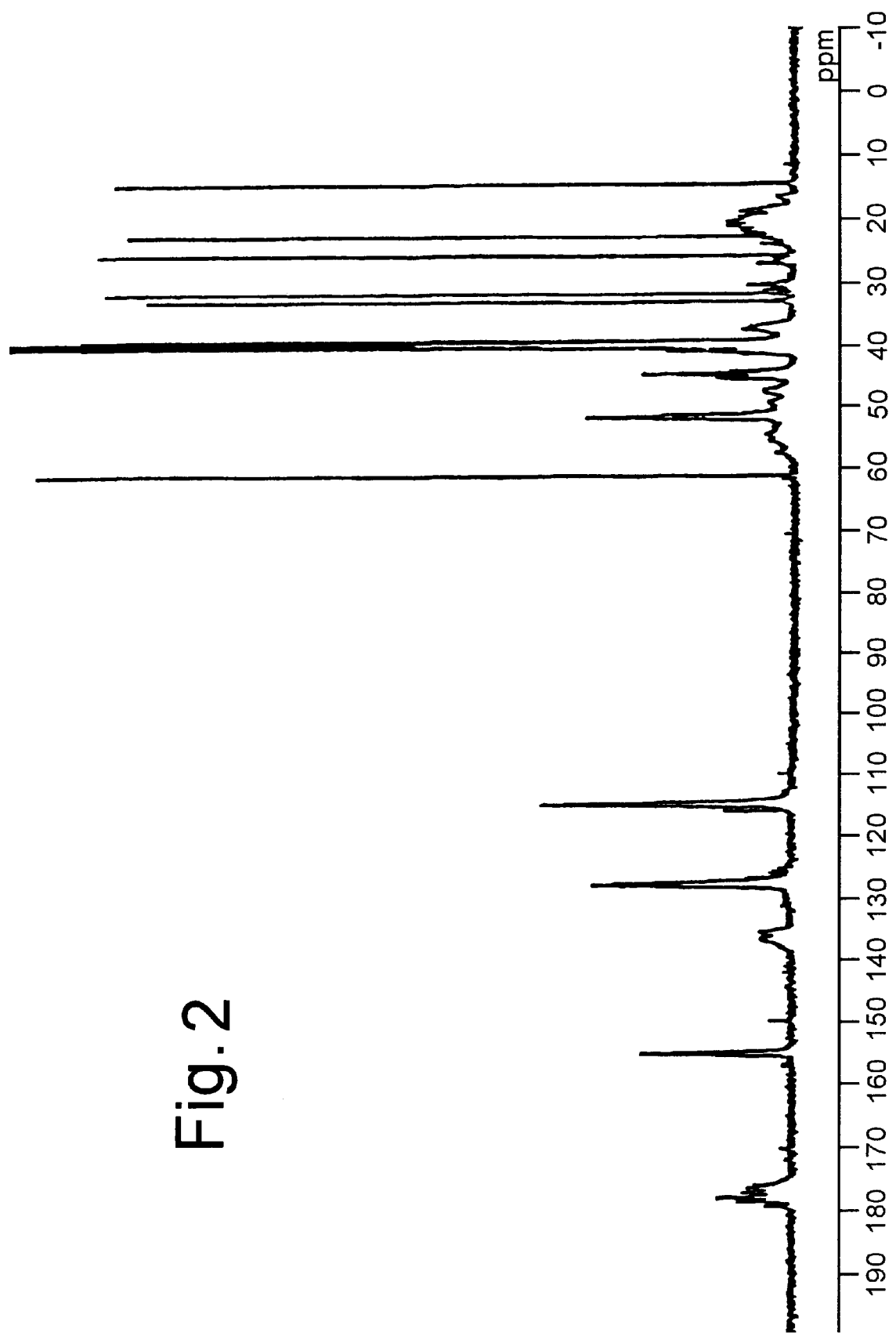
FIG. 2 shows a $^{13}$C-NMR spectrum of the copolymer of 4-(1-methylethenyl)phenol, (meth)methyl acrylate and (meth)acrylic acid prepared in Example 1, in $d_6$-dimethylsulfoxide.
Figure 3:
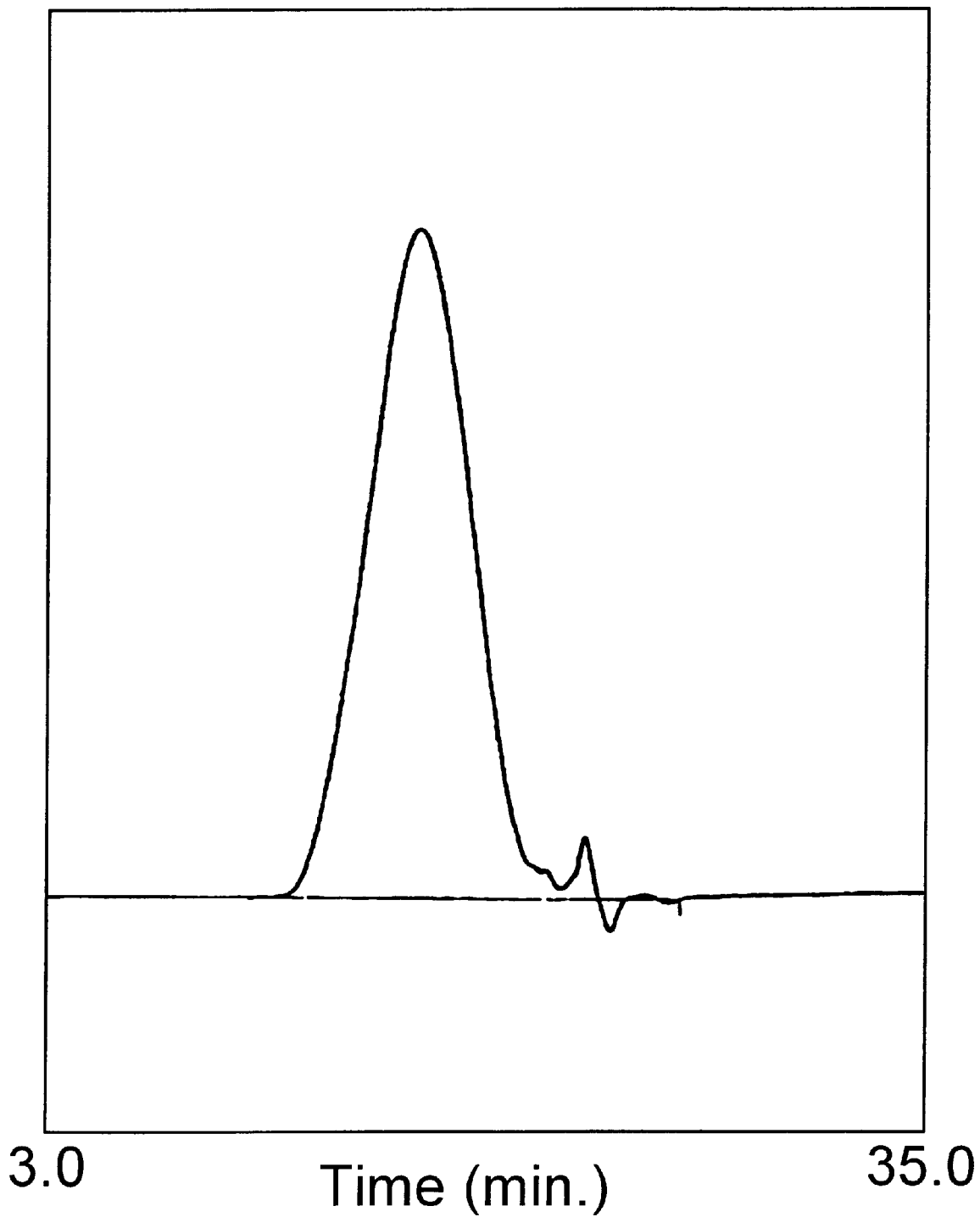
FIG. 3 shows a GPC elution curve for the copolymer of 4-(1-methylethenyl)phenol, (meth)methyl acrylate and (meth)acrylic acid prepared in Example 1.

The results of $^1$H-NMR, $^{13}$C-NMR and elemental analysis for the white polymer indicated that the polymer is a desired copolymer. FIGS. 1 and 2 show $^1$H-NMR and $^{13}$C-NMR spectra, respectively, for the copolymer in $d_6$-dimethylsulfoxide. These NMR results showed that the composition ratios a, b and c of the structural units represented by formulas (1), (2) and (3) were 0.34, 0.48 and 0.18, respectively, which were substantially equal to the charging ratios for the starting materials. GPC analysis using polystyrene as a standard indicated that the weight-average molecular weight (Mw) was 10,000 and the molecular-weight dispersion (Mw/Mn) was 1.94. FIG. 3 shows the GPC analysis.

It was attempted to dissolve the copolymer in diethylene glycol dimethyl ether or 2-heptanone, and in both solvents, at least 50% of the copolymer were dissolved.

The copolymer was dissolved in diethylene glycol dimethyl ether. The solution was applied on a copper-coated substrate with a bar coater in an amount to give a film having 5 μm of dry thickness. It was heated at 80° C. for 30 minutes to form a film, and immersed in a 2.38 wt % aqueous solution of tetrahydroammonium hydroxide (standard alkali developing solution). The film on the copper-coated substrate was dissolved within 1 minute. It indicated that the dissolution rate of the copolymer was 5 μm/min or higher in the standard alkali developing solution.

A substrate on which film was formed as described above was immersed in a 1.0 wt % aqueous solution of sodium carbonate (alkalescent developing solution), and it took 100 seconds for the film having 5 μm of thickness to be completely dissolved. It indicated that the dissolution rate of the copolymer was 3.0 μm/min in the alkalescent developing solution.

Figure 4:
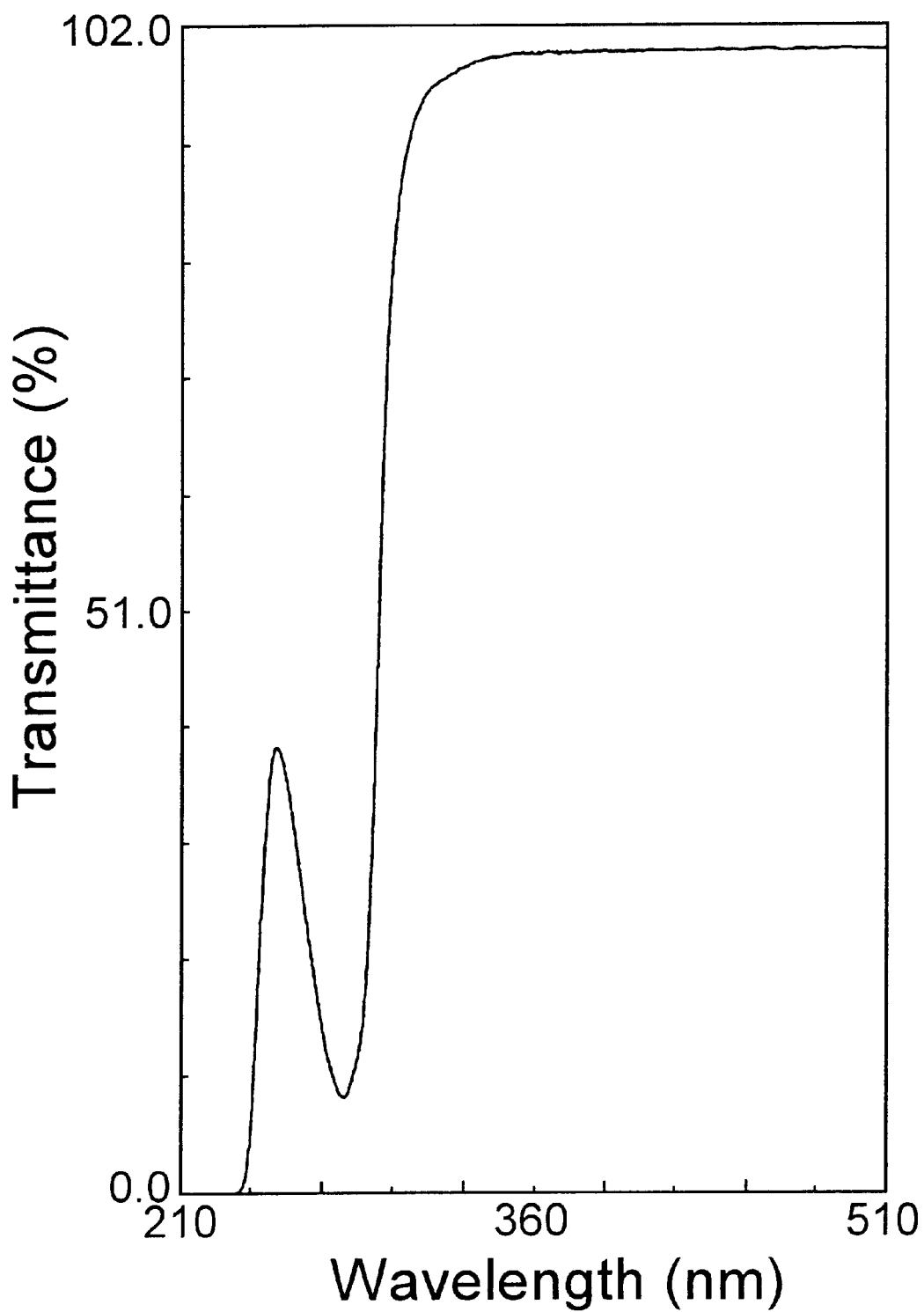
FIG. 4 shows spectrophotometry for ultraviolet and visible region for the copolymer of 4-(1-methylethenyl)phenol, (meth)methyl acrylate and (meth)acrylic acid prepared in Example 1.

The copolymer was dissolved in diethylene glycol dimethyl ether. The solution was applied on a quartz substrate with a spin coater in an amount to give a film having 1 μm of dry thickness. It was heated at 120° C. for 10 minutes to form a film. Its transmittance at 350 nm determined with a spectrophotometer for ultraviolet and visible region was 98% or higher. FIG. 4 shows the spectroscopic analysis in ultraviolet and visible region.

Figure 5:
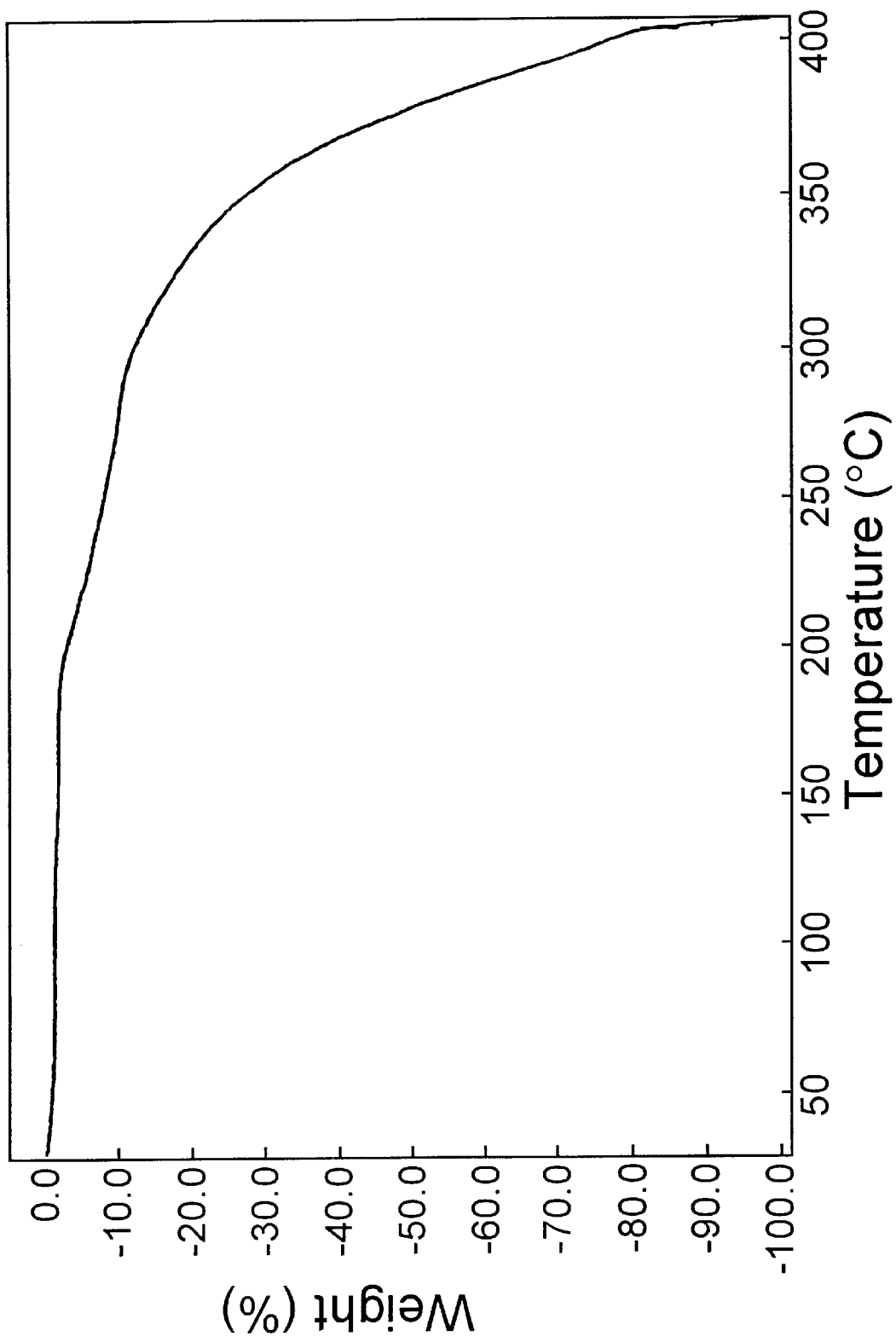
FIG. 5 shows thermogravimetry for the copolymer of 4-(1-methylethenyl)phenol, (meth)methyl acrylate and (meth)acrylic acid prepared in Example 1.

Its glass transition temperature determined with a differential scanning calorimeter was 125° C. It was found stable up to 200° C. or higher based on thermal stability determined with a differential thermal balance. FIG. 5 shows the thermogravimetric analysis.

EXAMPLES 2 TO 6

Reaction and work up were conducted as described in Example 1, except that PIPE, methyl acrylate and acrylic acid were charged in the amounts shown in Table 1 although the total molar amount was the same as that in Example 1 (3.34 mol). For a resulting copolymer, composition ratios, a yield, a weight-average molecular weight and molecular weight dispersion were determined as described in Example 1. It was evaluated for solvent solubility, a dissolution rate in a standard or alkalescent developing solution, a transparency and thermal stability as described in Example 1. The results of these analyses and evaluation are shown in Table 1 together with the results for Example 1.

COMPARATIVE EXAMPLE 1

Reaction, workup, analyses and evaluation were conducted as described in Example 1, except that 223.8 g of PIPE (1.67 mol) and 143.8 g of methyl acrylate (1.67 mol) were charged and acrylic acid was not used. Charging mole fractions and the results of analyses and evaluation for a product copolymer are shown in Table 1 together with the results for Examples 1 to 4.

COMPARATIVE EXAMPLE 2

Reaction, workup, analyses and evaluation were conducted as described in Example 1, except that 223.8 g of PIPE (1.67 mol) and 120.4 g of acrylic. acid (1.67 mol) were charged and methyl acrylate was not used. Charging mole fractions and the results of analyses and evaluation for a product copolymer are shown in Table 1 together with the results for Examples 1 to 4 and Comparative Example 1.

COMPARATIVE EXAMPLE 3

Reaction, workup, analyses and evaluation were conducted as described in Example 1, except that 143.8 g of methyl acrylate (1.67 mol) and 120.4 g of acrylic acid (1.67 mol) were charged and PIPE was not used. Charging mole fractions and the results of analyses and evaluation for a product copolymer are shown in Table 1 together with the results for Examples 1 to 4 and Comparative Examples 1 and 2.

TABLE 1

| | Polymerization (Upper: charging ratio Lower: composition ratio) | | | Polymerization results | | | | | | | |
|---|---|---|---|---|---|---|---|---|---|---|---|
| Example | PIPE a | Methyl acrylate b | Acrylic acid c | Yield (g) | Mw | Mw/Mn | Solvent solubility (wt %) | Dissolution rate in the standard alkali developing solution (μm/min) | Dissolution rate in the alkalescent developing solution (μm/min) | Transparency (%/μm) | Thermal stability (° C.) |
| 1 | 0.30 | 0.50 | 0.20 | 320.4 | 10,000 | 1.94 | >50 | >5 | 3.0 | >98 | >200 |
| | 0.34 | 0.48 | 0.18 | | | | | | | | |
| 2 | 0.20 | 0.65 | 0.15 | 321.1 | 9,500 | 1.78 | >50 | >5 | 7.5 | >98 | >200 |
| | 0.24 | 0.62 | 0.14 | | | | | | | | |
| 3 | 0.40 | 0.40 | 0.20 | 324.3 | 9,800 | 1.85 | >50 | >5 | 2.5 | >98 | >200 |
| | 0.43 | 0.38 | 0.19 | | | | | | | | |
| 4 | 0.30 | 0.40 | 0.30 | 319.0 | 9,900 | 1.91 | >50 | >5 | 3.0 | >98 | >200 |
| | 0.33 | 0.39 | 0.28 | | | | | | | | |
| 5 | 0.20 | 0.70 | 0.10 | 328.2 | 10,300 | 2.04 | >50 | >5 | 5.0 | >98 | >200 |
| | 0.22 | 0.67 | 0.11 | | | | | | | | |
| 6 | 0.15 | 0.70 | 0.15 | 316.9 | 10,500 | 1.88 | >50 | >5 | 7.5 | >98 | >200 |
| | 0.14 | 0.69 | 0.17 | | | | | | | | |
| Comp. Example 1 | 0.50 | 0.50 | — | 355.7 | 10,100 | 1.95 | >50 | <0.05 | <0.1 | >98 | >200 |
| Comp. Example 2 | 0.50 | — | 0.50 | 337.2 | 10,500 | 1.98 | 5 | >5 | 80 | >98 | >200 |
| Comp. Example 3 | — | 0.50 | 0.50 | 257.4 | 12,200 | 2.05 | 15 | >5 | 100 | >98 | — |

EXAMPLES 7 TO 11

Reaction, workup, analyses and evaluation were conducted as described in Example 1, except that methyl acrylate was replaced with one of (meth)acrylates in Table 2 in a mole fraction shown in Table 2. The results of analyses and evaluation for product copolymers are shown in Table 2 together with the results for Example 1.

COMPARATIVE EXAMPLE 4

Reaction, workup, analyses and evaluation were conducted as described in Example 1, except that 223.8 g of PIPE (1.67 mol) was charged, methyl acrylate was replaced with 213.8 g of tert-butyl acrylate (1.67 mol) and acrylic acid was not used. The results of analyses and evaluation for a product copolymer are shown in Table 2 together with the results for Examples 1 and 5 to 8.

TABLE 2

| | Polymerization (Upper: charging ratio Lower: composition ratio) | | | | Polymerization results | | | | | | | |
|---|---|---|---|---|---|---|---|---|---|---|---|---|
| Exam. | PIPE a | (Meth) acrylates Name | b | Acrylic acid c | Yield (g) | Mw | Mw/Mn | Solvent solubility (wt %) | Dissolution rate in the standard alkali developing solution (μm/min) | Dissolution rate in the alkalescent developing solution (μm/min) | Transparency (%/μm) | Thermal stability (° C.) |
| 1 | 0.30 0.34 | Methyl acrylate | 0.50 0.48 | 0.20 0.18 | 320.4 | 10,000 | 1.94 | >50 | >5 | 3.0 | >98 | >200 |
| 7 | 0.30 0.33 | Methyl methacrylate | 0.50 0.51 | 0.20 0.16 | 338.6 | 9,800 | 1.88 | >50 | >5 | 2.5 | >98 | >200 |
| 8 | 0.30 0.34 | 2-Hydroxyethyl acrylate | 0.50 0.47 | 0.20 0.19 | 350.1 | 9,900 | 1.95 | >50 | >5 | 3.0 | >98 | >200 |
| 9 | 0.30 0.32 | Ethyl acrylate | 0.50 0.46 | 0.20 0.22 | 332.0 | 9,300 | 1.75 | >50 | >5 | 3.0 | >98 | >200 |
| 10 | 0.30 0.35 | n-Butyl acrylate | 0.50 0.47 | 0.20 0.18 | 345.6 | 9,200 | 1.76 | >50 | >5 | 2.5 | >98 | >200 |
| 11 | 0.50 0.52 | t-Butyl acrylate | 0.30 0.28 | 0.20 0.20 | 346.1 | 9,400 | 1.85 | >50 | >5 | 2.0 | >98 | >200 |
| Comp. Exam. 4 | 0.50 0.54 | t-Butyl acrylate | 0.50 0.46 | 0 0 | 410.7 | 11,000 | 1.98 | >50 | <0.05 | <0.1 | >98 | >200 |

EXAMPLE 12

Into a 1,000 mL (inner volume) four-necked flask equipped with an agitator, a thermometer and a condenser were charged 134.2 g of PIPE (1.00 mol), 143.8 g of methyl acrylate (1.67 mol), 58.3 g of methacrylic acid (0.67 mol), 16.4 g of azobisisobutyronitrile (0.10 mol) and 400 mL of tetrahydrofuran. The mixture was then heated with stirring at an external temperature of 80° C. with a water bath, and then reacted for 8 hours while keeping the temperature. The reaction mixture was worked up as described in Example 1 to give a desired copolymer, for which analyses and evaluation were conducted as described in Example 1. The results of analyses and evaluation for the copolymer are shown in Table 3 together with the results for Example 1.

EXAMPLES 13 TO 16

Reaction, workup, analyses and evaluation were conducted as described in Example 1, except that tetrahydrofuran was replaced with one of the solvents in Table 4 in an amount shown in Table 4 and a reaction temperature and a reaction duration were changed as shown in Table 4. Composition ratios, yields, weight-average molecular weights and molecular-weight dispersions for product copolymers are shown in Table 4 together with the results for Example 1. These copolymers exhibited good solvent solubility, dissolving rate in a standard or alkalescent developing solution, transparency and thermal stability as was in Example 1.

TABLE 3

| | Polymerization (Upper: charging ratio Lower: composition ratio) | | | | Polymerization results | | | | | | | |
|---|---|---|---|---|---|---|---|---|---|---|---|---|
| Example | PIPE a | Methyl acrylate b | (Meth) acrylic acids Name | c | Yield (g) | Mw | Mw/Mn | Solvent solubility (wt %) | Dissolution rate in the standard alkali developing solution (μm/min) | Dissolution rate in the alkalescent developing solution (μm/min) | Transparency (%/μm) | Thermal stability (° C.) |
| 1 | 0.30 0.34 | 0.50 0.48 | Acrylic acid | 0.20 0.18 | 320.4 | 10,000 | 1.94 | >50 | >5 | 3.0 | >98 | >200 |
| 12 | 0.30 0.35 | 0.50 0.46 | Methacrylic acid | 0.20 0.19 | 328.2 | 9,500 | 1.79 | >50 | >5 | 3.0 | >98 | >200 |

TABLE 4

| | | Polymerization (Upper: charging ratio Lower: composition ratio) | | | | | | | | |
|---|---|---|---|---|---|---|---|---|---|---|
| | | Methyl | Acrylic | | | Polymerization | Polymerization | Polymerization results | | |
| | PIPE | acrylate | acid | Solvent | | temp. | duration | Yield | | |
| Exam. | a | b | c | Name | Amount (g) | (° C.) | (hour) | (g) | Mw | Mw/Mn |
| 1 | 0.30 | 0.50 | 0.20 | Tetrahydrofuran | 400 | 80 | 8 | 320.4 | 10,000 | 1.94 |
| | 0.34 | 0.48 | 0.18 | | | | | | | |
| 13 | 0.30 | 0.50 | 0.20 | 2-Ethylhexanol | 200 | 100 | 7 | 322.1 | 19,500 | 1.81 |
| | 0.31 | 0.19 | 0.20 | | | | | | | |
| 14 | 0.30 | 0.50 | 0.20 | n-Butyl alcohol | 600 | 110 | 12 | 319.9 | 7,600 | 1.83 |
| | 0.32 | 0.47 | 0.21 | | | | | | | |
| 15 | 0.30 | 0.50 | 0.20 | Methyl isobutyl ketone | 180 | 90 | 20 | 318.6 | 21,000 | 2.00 |
| | 0.34 | 0.49 | 0.17 | | | | | | | |
| 16 | 0.30 | 0.50 | 0.20 | Diethylene glycol dimethyl ether | 250 | 100 | 22 | 314.1 | 14,000 | 1.99 |
| | 0.33 | 0.48 | 0.19 | | | | | | | |

EXAMPLES 17 TO 21

Reaction, workup, analyses and evaluation were conducted as described in Example 1, except that azobisisobutyronitrile was replaced with one of the radical-polymerization initiators in Table 5 in an amount shown in Table 5 and a reaction temperature and a reaction duration were changed as shown in Table 5. Composition ratios, yields, weight-average molecular weights and molecular-weight dispersions for product copolymers are shown in Table 5 together with the results for Example 1. These copolymers exhibited good solvent solubility, dissolving rate in a standard or alkalescent developing solution, transparency and thermal stability as was in Example 1.

The latter mixture was stirred until it became a solution. The whole solution was transferred in the dropping funnel in two portions, and was added dropwise in the above four-necked flask over 5 hours. The mixture was stirred at 120° C. for additional 3 hours. Continuing stirring, the oil bath was removed and the reaction mixture was allowed to be cooled to room temperature (25° C.) over 3 hours to give a cyclohexanone solution (550 g) containing a copolymer.

The concentrations of the remaining monomers in the resulting solution were quantitatively analyzed by gas chro-

TABLE 5

| | | Polymerization (Upper: charging ratio Lower: composition ratio) | | | | | | | | |
|---|---|---|---|---|---|---|---|---|---|---|
| | | Methyl | Acrylic | Radical-polymerization | | Polymerization | Polymerization | Polymerization results | | |
| | PIPE | acrylate | acid | initiator | | temp. | duration | Yield | | MW/ |
| Exam. | a | b | c | Name | Amount (g) | (° C.) | (hour) | (g) | Mw | Mn |
| 1 | 0.30 | 0.50 | 0.20 | Azobisisobutyronitrile | 16.4 | 80 | 8 | 320.4 | 10,000 | 1.94 |
| | 0.34 | 0.48 | 0.18 | | | | | | | |
| 17 | 0.30 | 0.50 | 0.20 | Dimethyl azobisisobutyrate | 35.7 | 120 | 5 | 320.9 | 6,800 | 1.81 |
| | 0.33 | 0.49 | 0.18 | | | | | | | |
| 18 | 0.30 | 0.50 | 0.20 | Azobiscyclohexane-carbonitrile | 24.4 | 140 | 15 | 313.7 | 9,600 | 1.83 |
| | 0.31 | 0.47 | 0.22 | | | | | | | |
| 19 | 0.30 | 0.50 | 0.20 | Benzoyl peroxide | 12.0 | 100 | 20 | 315.6 | 25,000 | 2.00 |
| | 0.35 | 0.50 | 0.15 | | | | | | | |
| 20 | 0.30 | 0.50 | 0.20 | Di-t-butyl peroxide | 14.4 | 160 | 10 | 311.1 | 10,000 | 1.99 |
| | 0.33 | 0.47 | 0.20 | | | | | | | |
| 21 | 0.30 | 0.50 | 0.20 | Peroxydiisopropyl dicarbonate | 20.6 | 60 | 7 | 318.3 | 9,100 | 1.76 |
| | 0.36 | 0.47 | 0.17 | | | | | | | |

EXAMPLE 22

Into a 1,000 mL (inner volume) four-necked flask equipped with an agitator, a thermometer, a condenser and a 500 mL (inner volume) droppping funnel was charged 100 g of cyclohexanone as a resist solvent, which was then heated with stirring at an external temperature of 120° C. with an oil bath. Into a separate 1,000 mL Erlenmeyer flask were charged 93.9 g of PIPE (0.7 mol) purified by crystallization from its 2-ethylhexanol solution, 210.9 g of methyl acrylate (2.45 mol) purified by distillation, 25.2 g of acrylic acid (0.35 mol), 11.5 g of azobisisobutyronitrile (0.07 mol) as a radical-polymerization initiator and 120 mL of cyclohexanone.

matography; PIPE: 100 ppm, methyl acrylate: 0.4 wt % and acrylic, acid: 50 ppm. The polymer concentration in the solution was determined to be 60 wt %.

The solution was applied on a copper-coated substrate with a bar coater in an amount to give a film having 5 $\mu$m of dry thickness. It was heated at 80° C. for 30 minutes to form a film, and soaked in a 2.38 wt % aqueous solution of tetrahydroammonium hydroxide (standard alkali developing solution). The film on the copper-coated, substrate was dissolved within 1 minute. It indicated that the dissolution rate of the copolymer formed in the solution was 5 $\mu$m/min or higher in the standard alkali developing solution.

A substrate on which a film was formed as described above was soaked in a 1.0 wt % aqueous solution of sodium carbonate (alkalescent developing solution), and it took 60 seconds for the film having 5 μm of thickness to be completely dissolved. It indicated that the dissolution rate of the copolymer formed in the solution was 5.0 μm/min in the alkalescent developing solution.

The solution was applied on a quartz substrate with a spin coater in an amount to give a film having 1 μm of dry thickness. It was heated at 120° C. for 10 minutes to form a film. Its transmittance at 350 nm determined with a spectrophotometer for ultraviolet and visible region was 98% or higher.

EXAMPLES 23 AND 24

Reaction was conducted as described in Example 22, except that cyclohexanone was replaced with one of the resist solvents in Table 6.

The solution was analyzed for the concentrations of the remaining monomers in a resulting solution, a polymer concentration in the solution and a dissolution rate in a standard or alkalescent developing solution. The results of these analyses and evaluation are shown in Table 6 together with the results for Example 22.

COMPARATIVE EXAMPLE 5

Into the reaction flask described in Example 22 was charged 100 g of cyclohexanone, which was then heated with stirring at an external temperature of 50° C. with an oil bath. To the solvent was added dropwise a material solution prepared as described in Example 22 over 20 minutes. After dropping, the mixture was stirred for additional 30 minutes and allowed to be cooled to room temperature to give a copolymer-containing solution.

The solution was analyzed. for the concentrations of the remaining monomers in a resulting solution, a polymer concentration in the solution and a dissolution rate in a standard or alkalescent developing solution. The results of these analyses and evaluation are shown in Table 6 together with the results for Example 22.

What is claimed is:

1. A copolymer consisting essentially of structural units represented by formula (1):

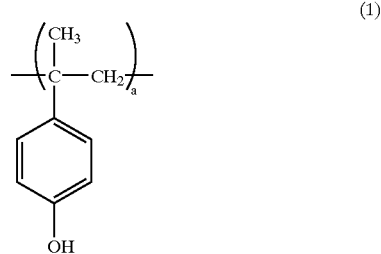

formula (2):

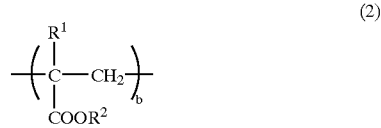

where $R^1$ is hydrogen or methyl and $R^2$ is $C_1$–$C_6$ straight or branched unsubstituted alkyl or $C_1$–$C_6$ straight or branched substituted alkyl, and formula (3):

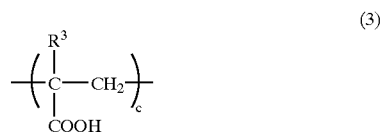

where $R^3$ is hydrogen or methyl,
wherein a, b and c are 0.05 to 0.7, 15 to 0.8 and 0.01 to 0.5, respectively and a+b+c=1.

2. A copolymer as claimed in claim 1 where a, b and c are 0.10 to 0.45, 0.30 to 0.8 and 0.05 to 0.30, respectively and a+b+c=1.

3. A copolymer as claimed in claim 1 where a, b and c are 0.10 to 0.30, 0.50 to 0.8 and 0.05 to 0.20, respectively and a+b+c=1.

4. A copolymer as claimed in any claim 1 where $R^2$ in the structural unit represented by formula (2) is $C_1$–$C_6$ straight

TABLE 6

| | | | | | | | Analysis results | | | | Evaluation results | |
| | | | | | | | Monomer concentrations in the solution | | | Polymer | Dissolution rate in the standard alkali developing solution | Dissolution rate in the alkalescent developing solution |
| | Polymerization (Charging ratio, solvent) | | | | | | | | | | | |
| | PIPE | Methyl acrylate | Acrylic acid | Solvent | | | PIPE | Methyl acrylate | Acrylic acid | concentration in the solution | | |
| Exam. | a | b | c | Name | Amount (g) | | (ppm) | (%) | (ppm) | (%) | (μm/min) | (μm/min) |
| 22 | 0.20 | 0.70 | 0.10 | Cyclohexanone | 220 | | 100 | 0.4 | 50 | 60 | >5 | 5.0 |
| 23 | 0.20 | 0.70 | 0.10 | Ethyl lactate | 200 | | 200 | 0.2 | 100 | 60 | >5 | 7.5 |
| 24 | 0.20 | 0.70 | 0.10 | Propylene glycol monomethyl ether acetate | 220 | | 100 | 0.1 | 200 | 60 | >5 | 5.0 |
| Comp. Exam. 5 | 0.20 | 0.70 | 0.10 | Cyclohexanone | 220 | | 0.7 | 8.0 | 500 | 50 | >5 | 100 | or branched unsubstituted primary or secondary alkyl or $C_1$–$C_6$ straight or branched hydroxylated primary or secondary alkyl.

5. A copolymer as claimed in claim 1 where $R^2$ in the structural unit represented by formula (2) is selected from the group consisting of methyl, ethyl, n-propyl, isopropyl, n-butyl, isobutyl, sec-butyl and 2-hydroxyethyl.

6. A copolymer as claimed in claim 1 whose weight-average molecular weight and molecular-weight dispersion are 3,000 to 50,000 and 1.0 to 3.0, respectively.

7. A copolymer as claimed in claim 1 whose glass transition point is 30 to 150° C.

8. A copolymer as claimed in claim 1 whose transmittance at 350 nm is at least 90%/μm.

9. A copolymer as claimed in claim 1 whose dissolution rate in a 2.38 wt % aqueous solution of tetramethylammonium hydroxide is at least 1 μm/min.

10. A process for manufacturing a copolymer as claimed in claim 1, comprising heating a mixture of (a) 4-(1-methylethenyl)phenol, (b) a (meth)acrylate represented by formula (4):

where $R^1$ is hydrogen or methyl and $R^2$ is $C_1$–$C_6$ straight or branched unsubstituted alkyl or $C_1$–$C_6$ straight or branched substituted alkyl, (c) a (meth)acrylic acid represented by formula (5):

where $R^3$ is hydrogen or methyl, (d) a radical-polymerization initiator, and (e) a solvent, in which the mole fractions of (a) 4-(1-methylethenyl)phenol, (b) the (meth)acrylate and (c) the (meth)acrylic acid are 0.05 to 0.7, 0.15 to 0.8 and 0.01 to 0.5, respectively and the total of the mole fractions is 1.

11. A process for manufacturing a copolymer as claimed in claim 2, comprising heating a mixture of (a) 4-(1-methylethenyl)phenol, (b) a (meth)acrylate represented by formula (4), (c) a (meth)acrylic acid represented by formula (5), (d) a radical-polymerization initiator, and (e) a solvent, in which the mole fractions of (a) 4-(1-methylethenyl)phenol, (b) the (meth)acrylate and (c) the (meth)acrylic acid are 0.10 to 0.45, 0.30 to 0.8 and 0.05 to 0.30, respectively and the total of the mole fractions is 1.

12. A process for manufacturing a copolymer as claimed in claim 3, comprising heating a mixture of (a) 4-(1-methylethenyl)phenol, (b) a (meth)acrylate represented by formula (4), (c) a (meth)acrylic acid represented by formula (5), (d) a radical-polymerization initiator, and (e) a solvent, in which the mole fractions of (a) 4-(1-methylethenyl)phenol, (b) the (meth)acrylate and (c) the (meth)acrylic acid are 0.10 to 0.30, 0.50 to 0.8 and 0.05 to 0.20, respectively and the total of the mole fractions is 1.

13. A process as claimed in claim 10 heating the materials while continuously or intermittently supplying (a) 4-(1-methylethenyl)phenol, (b) the (meth)acrylate and/or (c) the (meth)acrylic acid into the reaction system to maintain the total concentration of (a), (b) and (c) in the reaction system at 20 wt % or lower throughout the heating step.

14. A process as claimed in claim 10 where the (meth)acrylate represented by formula (4) is selected from the group consisting of unsubstituted primary or secondary alkyl acrylate, hydroxylated primary or secondary alkyl acrylate, unsubstituted primary or secondary alkyl methacrylate, and hydroxylated primary or secondary alkyl methacrylate.

15. A process as claimed in claim 14 where the (meth)acrylate represented by formula (4) is selected from the group consisting of methyl acrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butyl methacrylate, isobutyl methacrylate, sec-butyl methacrylate and 2-hydroxyethyl methacrylate.

16. A process as claimed in claim 10 where the radical-polymerization initiator is selected from the group consisting of azobisisobutyronitrile, azobis-2,4-dimethylvaleronitrile, azobiscyclohexanecarbonitrile, dimethyl azobisisobutyrate, benzoyl peroxide, 2,4-dichlorobenzoyl peroxide, di-tert-butyl peroxide, peroxylauroyl, peroxydiisopropyl dicarbonate and acetyl peroxide.

17. A process as claimed in claim 10 where the materials are heated at 50 to 180° C.

18. A solution containing 25 to 75 wt % of a copolymer as claimed in claim 1 prepared by heating a mixture of (a) 4-(1-methylethenyl)phenol, (b) a (meth)acrylate represented by formula (4), (c) a (meth)acrylic acid represented by formula (5), (d) a radical-polymerization initiator, and (e) a resist solvent, in which the mole fractions of (a), (b) and (c) are 0.05 to 0.7, 0.15 to 0.8 and 0.01 to 0.5, respectively and the total of the mole fractions is 1, and then optionally concentrating or diluting the mixture to adjust the concentrations of (a), (b) and (c) in the whole solution to 50 ppb to 0.5 wt %, 5 ppm to 5 wt % and 200 ppb to 2 wt %, respectively.

19. A solution as claimed in claim 18 containing 25 to 75 wt % of a copolymer where a, b and c are 0.10 to 0.45, 0.30 to 0.8 and 0.05 to 0.30, respectively and a+b+c=1, where the mole fractions of (a), (b) and (c) are 0.10 to 0.45, 0.30 to 0.8 and 0.05 to 0.30, respectively and the total of the mole fractions is 1, and the concentrations of (a), (b) and (c) in the whole solution are adjusted to 50 ppb to 0.5 wt %, 5 ppm to 5 wt % and 200 ppb to 2 wt %, respectively.

20. A solution as claimed in claim 18 containing 25 to 75 wt % of a copolymer where a, b and c are 0.10 to 0.30, 0.50 to 0.8 and 0.05 to 0.20, respectively and a+b+c=1, where the mole fractions of (a), (b) and (c) are 0.10 to 0.30, 0.50 to 0.8 and 0.05 to 0.20, respectively and the total of the mole fractions is 1, and the concentrations of (a), (b) and (c) in the whole solution are adjusted to 50 ppb to 0.5 wt %, 5 ppm to 5 wt % and 200 ppb to 2 wt %, respectively.

21. A solution as claimed in claim 18 where the (meth)acrylate represented by formula (4) is selected from the group consisting of unsubstituted primary or secondary alkyl acrylate, hydroxylated primary or secondary alkyl acrylate, unsubstituted primary or secondary alkyl methacrylate, and hydroxylated primary or secondary alkyl methacrylate.

22. A solution as claimed in claim 21 where the acrylate represented by formula (4) is selected from the group consisting of methyl acrylate, ethyl acrylate, n-propyl acrylate, isopropyl acrylate, n-butyl acrylate, isobutylacrylate sec-butyl acrylate, 2-hydroxyethyl acrylate, methyl methacrylate, ethyl methacrylate, n-propyl methacrylate, isopropyl methacrylate, n-butyl methacrylate, isobutyl methacrylate, sec-butyl methacrylate and 2-hydroxyethyl methacrylate.

23. A solution as claimed in claim 18 where the radical-polymerization initiator is selected from the group consisting of azobisisobutyronitrile, azobis-2,4-dimethylvaleronitrile, azobiscyclohexanecarbonitrile, dimethyl azobisisobutyrate, benzoyl peroxide, 2,4-dichlorobenzoyl peroxide, di-tert-butyl peroxide, peroxylauroyl peroxydiisopropyl dicarbonate and acetyl peroxide.

24. A solution as claimed in claim 18 where the resist solvent is selected from the group consisting of ketones, alcohols, polyols, polyol derivatives, cyclic ethers and esters.

25. A solution as claimed in claim 18 where throughout heating, (a) 4-(1-methylethenyl)phenol, (b) a (meth)acrylate and/or (c) a (meth)acrylic acid are continuously or intermittently supplied to maintain the total concentration of (a), (b) and (c) at 20 wt % or lower.

26. A solution as claimed in claim 18 where the materials are heated at 50 to 180° C.

27. A solution as claimed in claim 18 where the concentrations of (a), (b) and (c) in the whole solution are 100 ppb to 0.1 wt %, 10 ppm to 3 wt %, and 500 ppb to 1 wt %, respectively.

28. A solution as claimed in claim 18 where the film formed by applying the solution on a substrate and then heating the substrate has a dissolution rate in a 2.38 wt % aqueous solution of tetramethylammonium hydroxide is at least 1 $\mu$m/min.

29. A solution as claimed in claim 18 where the film formed by applying the solution on a quartz substrate and then heating the substrate has a transmittance of at least 90%/$\mu$m at 350 nm.

* * * * *